(12) United States Patent
Hattori et al.

(10) Patent No.: US 7,525,127 B2
(45) Date of Patent: Apr. 28, 2009

(54) SEMICONDUCTOR LIGHT EMITTING DEVICE

(75) Inventors: Yasushi Hattori, Kawasaki (JP); Shinji Saito, Yokohama (JP); Shinya Nunoue, Ichikawa (JP); Masahiro Yamamoto, Kawasaki (JP); Naomi Shida, Minato-ku (JP); Kei Kaneko, Odawara (JP); Genichi Hatakoshi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 11/287,236

(22) Filed: Nov. 28, 2005

(65) Prior Publication Data

US 2006/0291246 A1 Dec. 28, 2006

(30) Foreign Application Priority Data

Jun. 22, 2005 (JP) ............................. 2005-182403

(51) Int. Cl.
*H01L 27/15* (2006.01)
(52) U.S. Cl. .................. 257/99; 257/100; 257/E33.059
(58) Field of Classification Search .................. 257/99, 257/100, E33.059
See application file for complete search history.

(56) References Cited

U.S. PATENT DOCUMENTS

| | | | | | |
|---|---|---|---|---|---|
| 5,952,681 | A | * | 9/1999 | Chen | ........................... 257/89 |
| 6,057,561 | A | * | 5/2000 | Kawasaki et al. | ............. 257/94 |
| 6,166,856 | A | * | 12/2000 | Araki et al. | ................. 359/627 |
| 2003/0038295 | A1 | * | 2/2003 | Koda | ............................ 257/98 |
| 2006/0002125 | A1 | * | 1/2006 | Kim et al. | .................... 362/509 |
| 2006/0198162 | A1 | * | 9/2006 | Ishidu et al. | .................. 257/98 |
| 2007/0034889 | A1 | * | 2/2007 | Waitl et al. | .................... 257/99 |
| 2007/0069227 | A1 | * | 3/2007 | Grotsch et al. | ................ 257/98 |

FOREIGN PATENT DOCUMENTS

| | | |
|---|---|---|
| JP | 7-282609 | 10/1995 |
| JP | 2001-243821 | 9/2001 |
| JP | 2002-57375 | 2/2002 |
| JP | 2004-221163 | 8/2004 |

OTHER PUBLICATIONS

U.S. Appl. No. 11/287,236, filed Nov. 28, 2005, Hattori et al.
U.S. Appl. No. 11/348,410, filed Feb. 7, 2006, Kaneko et al.
U.S. Appl. No. 11/355,886, filed Feb. 17, 2006, Kaneko et al.

* cited by examiner

*Primary Examiner*—Davienne Monbleau
*Assistant Examiner*—Matthew Reames
(74) *Attorney, Agent, or Firm*—Oblon, Spivak, McClelland, Maier & Neustadt, P.C.

(57) ABSTRACT

A semiconductor light emitting element includes a semiconductor light emitting element emitting light beams in ultraviolet ranges and visible ranges, and a fluorescent element absorbing the light beams from the semiconductor light emitting element and outputting visible light beams in a light taking-out direction different from a light emitting direction. The light beams emitted from the light emitting element are absorbed within the semiconductor light emitting device.

17 Claims, 15 Drawing Sheets

SEMICONDUCTOR LIGHT EMITTING DEVICE

CROSS REFERENCE TO RELATED APPLICATIONS

This invention is based upon and claims the benefit of priority from prior Japanese Patent Application No. 2005-182,403 filed on Jun. 22, 2005; the entire contents of which are incorporated by reference herein.

BACKGROUND OF THE INVENTION

1. Field of the Invention

This invention relates to a semiconductor light emitting device, and more particularly relates to a semiconductor light emitting device including a semiconductor light emitting elements and a fluorescent element.

2. Description of the Related Art

Japanese Patent Laid-Open Publication No. 2004-221,163 (called "Reference 1") describes a light emitting device which can emit uniform light beams in an observing direction. The light emitting device includes not only a light emitting element but also light diffusing particulates which are provided on the light emitting element and diffuse light beams. Both of the light emitting element and light diffusing particulates are housed in a translucent seal.

Further, Japanese Patent Laid-Open Publication No. Hei 07-282,609 (called "Reference 2") describes an illumination light source which consumes less power, is durable, and is able to reliably emit optimum illuminating light beams such as incandescent light. The illumination light source includes a semiconductor laser element emitting laser beam, a lens diffusing laser beams from the semiconductor laser element, and a fluorescent element converting laser beams into visible light beams and emitting visible light beams.

The Reference 1 (the light emitting device) and Reference 2 (the illumination light source) do not seem to give any consideration to the following problems. In the Reference 1, light beams are emitted and diffused in the same direction. Further, in the Reference 2, light beams are emitted and diffused in the same direction. Therefore, some light beams may leak out of the light emitting element or semiconductor laser element, so that it is impossible to use the light emitting element which outputs high energy light beams such as ultraviolet light and laser beams. The ultraviolet light beams and laser beams should not be directly observed. Still further, the devices of the References 1 and 2 do not seem to be suitable to be applicable to lighting systems, image displays and so on which are required to emit sufficiently bright light beams.

BRIEF SUMMARY OF THE INVENTION

The present invention has been contemplated in order to overcome the foregoing problems of the related art, and is intended to provide a semiconductor light emitting device which can reliably emit high intensity light beams and assure high brightness.

In accordance with a first aspect of the embodiment of the invention, there is provided a semiconductor light emitting device which includes: a semiconductor light emitting element emitting light beams in ultraviolet ranges and visible ranges; and a fluorescent element absorbing the light beams emitted from the semiconductor light emitting element, and outputting visible light beams in a light taking-out direction which is different from a light emitting direction of the semiconductor light emitting element. The light beams emitted from the light emitting element is absorbed within the semiconductor light emitting device.

According to a second aspect of the embodiment of the invention, there is provided a semiconductor light emitting device which includes: a substrate; a light emitting element provided on the substrate, and emitting light beams within ultraviolet ranges and visible ranges along the surface of the substrate; a fluorescent element absorbing the light beams emitted from the semiconductor light emitting element, and outputting visible light beams; and a reflector which includes a first reflecting surface which reflects the visible light beams from the fluorescent element in a direction crossing the surface of the substrate, and a second reflecting surface which reflects the light beams, emitted from the semiconductor light emitting element and passing through the fluorescent element, toward the fluorescent element, an angle of the second reflecting surface with respect to the surface of the substrate being different from that of the first reflecting surface.

In accordance with a third aspect of the embodiment of the invention, there is provided a semiconductor light emitting device which includes: a substrate; a light emitting element provided on the substrate, and emitting light beams within ultraviolet ranges and visible ranges along the surface of the substrate; and a fluorescent element which has not only a light absorbing area where direct light beams from the semiconductor light emitting element are illuminated but also a light diffusing area where visible light beams are outputted in a light taking-out direction intersecting the surface of the substrate, the light diffusing area being larger than the light absorbing area.

DETAILED DESCRIPTION OF THE INVENTION

Following is a more detailed description of the invention as illustrated by the attached drawings, in which like numerals refer to like parts throughout.

First Embodiment

[Overall Configuration of Semiconductor Light Emitting Device]

Figure 1:
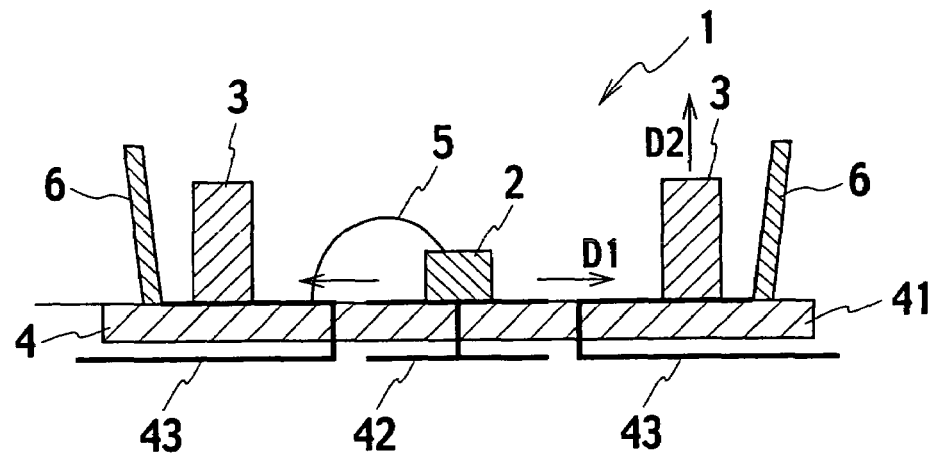
FIG. 1 is a cross section of a semiconductor light emitting device according to a first embodiment of the invention.
Figure 2:
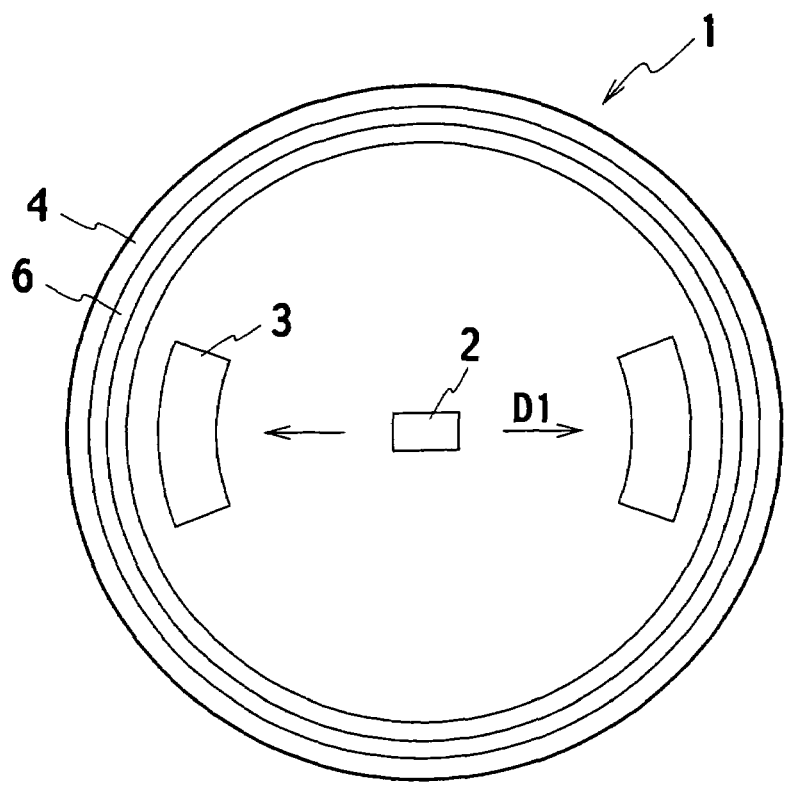
FIG. 2 is a top plan view of the semiconductor light emitting device of FIG. 1.

Referring to FIG. 1 and FIG. 2, a semiconductor light emitting device 1 includes a semiconductor light emitting element 2 (called the "light emitting element 2") and fluorescent elements 3. The light emitting element 2 emits light beams in ultraviolet and visible ranges in a first direction D1 while the fluorescent elements 3 absorb all of light beams from the light emitting element 2, and transmit visible light beams in a second direction D2 which is different from the first direction D1. In other words, the light beams from the semiconductor light emitting element 2 are designed not to be directly emitted in the light take-out direction. The light emitting element 2 and the fluorescent elements 3 are separate from one another. Further, the semiconductor light emitting device 1 includes a substrate 4 having wirings 42 and 43 providing power to the light emitting element 2, and a reflector 6 reflecting the light beams from the fluorescent light beams in the second direction D2.

In the first embodiment, the substrate 4 is in the shape of a disc, and receives the light emitting element 2 on the center thereof. The light emitting element 2 emits light beams in the two first directions D1 which are shifted from each other by 180 degrees, so that the two fluorescent elements 3 are provided at opposite positions on the substrate 4.

The term "first directions D1" denotes the directions in which the light emitting element 2 emits light beams, and agrees with the optical axis of light beams emitted by the light emitting element 2. Each of the first directions D1 agrees with the peak of light intensity. Further, the light beams from the light emitting element 2 are in parallel to the surface of the substrate 4, i.e., each first direction D1 is substantially in parallel to the surface of the substrate 4. In short, the light emitting element 2 emits the light beams directly along the surface of the substrate 4 (direct light beams).

Light beams are absorbed as follows: all of direct light beams from the light emitting element 2 are absorbed by the fluorescent elements 3; and most of light beams from the light emitting element 2 is absorbed by the fluorescent elements 3 but a part of such light beams are reflected; and a part of light beams pass through the fluorescent elements 3, are reflected by the reflector 6 and are re-absorbed by the fluorescent elements 3. Further, light beams by the light emitting element 2 are classified into: the direct light beams; light beams which are not sent to the fluorescent elements 3 but leak from the light emitting element 2; light beams which pass through the fluorescent elements 3 and are not diffused by the fluorescent elements 3 in the light take-out direction; light beams which are directly illuminated onto the reflector 6 and are reflected; and light beams which pass through the fluorescent elements 3 but are not reflected by the reflector 6 and are not outputted in the light take-out direction. Needless to say, light beams which are output in the light take-out direction are "indirect light beams".

[Structure of Substrate]

As shown in FIG. 1 and FIG. 2, the substrate 4 is constituted by a substrate base 41, a wiring 42 provided on the front and rear centers thereof, and a wiring 43 provided on the front and rear peripheral surfaces thereof. The wiring 42 is electrically connected to the front and rear centers of the substrate 4 via a through-hole. The wiring 43 is electrically connected to a second main electrode of the light emitting element 2 using a wire 5.

The substrate base 41 efficiently dissipates heat generated in response to the operation of the light emitting element 2, and is preferably made of a material having good heat conductivity, e.g., AlN, $Al_2O_3$, BN, plastics, ceramics, or diamond. The wirings 42 and 43 are preferably made of thin-film or thick-film wires having a small wiring resistance and a small absorption factor for visible light beams, e.g., Au, Ag, Cu, Cu alloy, or W. In order to improve bonding ability, the wirings 42 and 43 may be provided with an Au-plated layer, an Ag-plated layer or, Pd-plated layer, or a soldered layer may be formed on the wirings 42 and 43. The wire 5 may be preferably made of Au, or a combination of a precious metal such as Pt and Au.

[Structure of Reflector]

Referring to FIG. 1 and FIG. 2, the reflector 6 is positioned outside the fluorescent elements 3, and extends around the substrate 4. The fluorescent elements 3 generally diffuses light beams in the second direction D2. However, light beams diffused by the fluorescent elements 3 in the first direction D1 are reflected by the reflector 6 in the second direction D2.

The second direction D2 differs from the first direction D1. The optical axis of light beams diffused from the fluorescent elements 3 intersects with the surface of the substrate 4. A clockwise angle α1 formed by the surface of the substrate 4 and a reflecting surface of the reflector 6 is set within a range expressed by:

$$90 \text{ degrees} < \alpha 1 < 180 \text{ degrees}.$$

In the first embodiment, the angle α1 of the reflector 6 is between 120 degrees and 150 degrees. Therefore, the second direction D2 deviates from the surface of the substrate 4 by a clockwise angle β1 which is in a range expressed by:

$$60 \text{ degrees} < \beta 1 < 120 \text{ degrees}.$$

The reflector 6 is preferably made of a material having excellent thermal conductivity such as AlN, $Al_2O_3$, BN, plastics, ceramics, or diamond, and efficiently dissipates heat generated in response to the operation of the light emitting element 2. Further, in order to positively reflect light beams from the fluorescent elements 3, the reflector 6 has its reflecting surface covered with a filler, a light diffusing agent (e.g., barium titanic acid, titanium oxide, aluminum oxide, silicon oxide, silicon dioxide, heavy calcium carbonate, or light calcium carbonate), an Ag-plated coating layer, or an organic phosphors. The organic phosphors promotes effective use of light beams.

Figure 7:
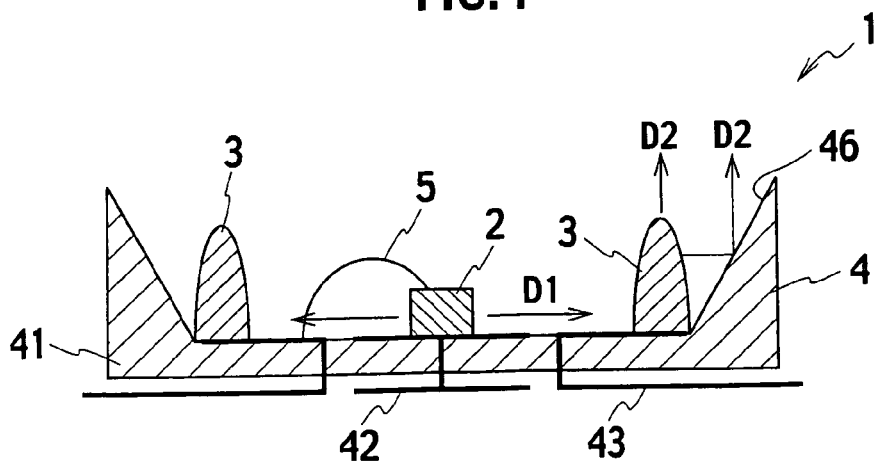
FIG. 7 is a cross section of a further semiconductor light emitting device in an example of the first embodiment.

In the first embodiment, the reflector 6 is independent from the substrate 4, and is attached to the substrate 4 using an adhesive, or is mechanically attached using a fastener. Alternatively, the reflector 4 may be integral with the substrate 4 (refer to FIG. 7).

[First Structure of Light Emitting Element]

Figure 3:
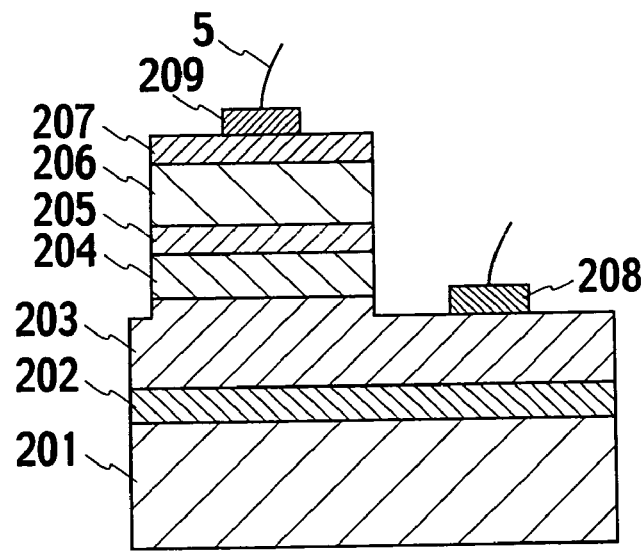
FIG. 3 is a cross section of an essential part of a light emitting element in the semiconductor light emitting device of FIG. 1.

As shown in FIG. 3, the light emitting element 2 includes an AlGaInN light emitting layer (or an AlGaInN active layer) 205 made of a III-group nitrogen compound semiconductor, which is expressed by $Al_X Ga_Y In_{1-X-Y} N$ ($0 \leq X \leq 1$, $0 \leq Y \leq 1$, $0 \leq X+Y \leq 1$). The III-group nitrogen compounds cover 2-element substances AlN, GaN and InN, 3-element substances $Al_X Ga_{1-X} N$, $Al_X In_{1-X} N$ and $Ga_X In_{1-X} N$ ($0 < X < 1$), and 4-element substances containing all of the foregoing elements. Further, a part of substances of the III-group nitrogen compound semiconductor may be substituted by B, Tl and so on. Still further, a part of N of the foregoing semiconductor may be substituted by P, As, Sb, Bi and so on.

The light emitting element 2 is constituted by a sapphire substrate 201, an AlGaInN buffer layer 202, an n-type AlGaInN contact layer 203, an n-type AlGaInN cladding layer 204, an AlGaInN light emitting layer 205, a p-type AlGaInN cladding layer 206, and p-type AlGaInN contact layer 207, all of which are stacked one over after another. An n-type electrode (a first main electrode) 208 is provided on the n-type AlGaInN contact layer 203, and a p-type electrode (a second main electrode) 209 is provided on the p-type AlGaInN contact layer 207.

[Second Structure of Light Emitting Element]

Figure 4:
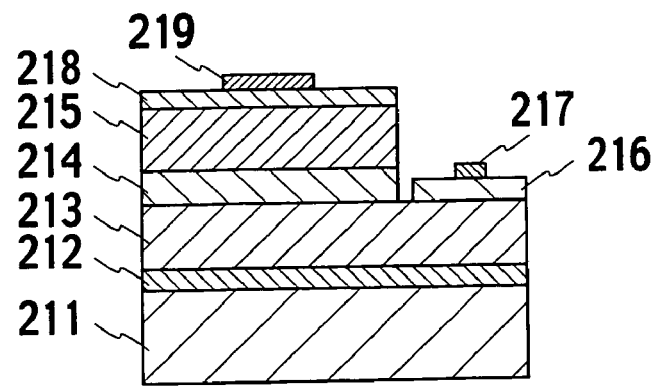
FIG. 4 is a cross section of an essential part of another light emitting element in the semiconductor light emitting device of FIG. 1.

Alternatively, the light emitting element 2 may be a laser diode having an MgZnO light emitting layer (or an MgZnO active layer) 214, a super luminescent diode, or a light emitting diode sending forth ultraviolet light beams. Refer to FIG. 4. In detail, MgZnO is $M_{gX} Z_{n1-X} O (0 \leq X \leq 1)$ Specifically, the light emitting element 2 may be constituted by a sapphire substrate 211, a ZnO buffer layer 212, a p-type MgZnO layer 213, an MgZnO light emitting layer 214, and an n-type MgZnO layer 215, all of which are stacked one over after another. A metal electrode (a first main electrode) 217 is provided on the p-type MgZnO layer 213 via an ITO electrode layer 216. Further, a metal electrode (a second main electrode) 219 is provided on the n-type MgZnO layer 215 via an ITO electrode layer 218.

[Structure of Fluorescent Elements]

In the first embodiment, the fluorescent elements 3 are made of matrix (or base materials).

The matrix may be a silicone resin, an epoxy resin, an urea resin, a fluorocarbon resin, an acrylic resin, or a polyimide resin, all of which have high optical conductivity and are resistant to heat. Especially, the epoxy resin or silicone resin is most preferable since they are easily available, easy to handle and less expensive. Alternatively, the matrix may be a ceramics structure or the like in which glass, a sintered body, YAG (yttrium-aluminum-garnet) and $Al_2O_3$ are combined.

The fluorescent materials in the first embodiment are composed of any one of Sr, Ba and Ca, and O or N, and Si and Er. Alternatively, the fluorescent materials may be any one of Sr, Ba and Ca, and Mg or Al, and Ce or Eu, and O or N, and Si. In other words, the fluorescent materials are made of the substances listed in items (1) to (10).

(1) Silicate fluorescent materials: $(Sr1_{X-Y-Z} Ba_X Ca_Y Eu_Z)_2 Si_W O_{2+2Q}$ ($0 \leq X \leq 1$, $0 \leq Y \leq 1$, $0.05 \leq Z \leq 0.2$, and $0.90 \leq Z \leq 1.10$) It is most preferable that X=0.19, Y=0, Z=0.05, and W=1.0.

(2) Silicate fluorescent materials: $(Sr_{1X-Y-Z} Ba_X Ca_Y Eu_Z)_2 SiO_4$ ($0 \leq X \leq 1$, $0 \leq Y \leq 1.0$, and $0.05 \leq Z \leq 0.2$)

Sr, Ba or Ca may be substituted by Mg or Zn in order to stabilize a crystal structure and improve light emitting intensity of the silicate fluorescent materials. Further, in order to control luminescent colors, a part of Si may be substituted by Ge (e.g., $(Sr1_{X-Y-Z} Ba_X Ca_Y Eu_Z)_2 (Si_{1-U} Ge_U) O_4$).

(3) Aluminates fluorescent materials: $(M_{1-X} Eu_X) (M'_{1-Y} Mn_Y) Al_{10} O_{17}$ In the aluminates fluorescent materials, M is Ba, Sr or Ca, and M' is Mg or Zn. A composition ratio satisfies the range of $0 < X < 1$, and $0 \leq Y \leq 0.05$.

(4) Aluminates fluorescent materials: $(M_{3-Y} M'_Y) Al_{16} O_{27}$

In the aluminates fluorescent materials, M is Ba, Sr or Ca, and M' is Mg, Zn, Eu or Mn.

(5) Nitride fluorescent materials (mainly silicon nitride fluorescent materials): $L_X Si_Y N_{(2/3X+4/3Y-2/3Z)}$; Eu or $L_X Si_Y O_Z N_{(2/3X+4/3Y-2/3Z)}$; Eu.

L is Sr or Ca, or both of Sr and Ca. In the general formula, preferably X=2 and Y=5, or X=1 and Y=7. Alternatively, X and Y may be optional values. Speifically, the basic constituents are fluorescent materials to which Mn is added, e.g., $(Sr_XCa_{1-X})_2$ $Si_5N_8$; Eu (0<X<1), $Sr_2Si_5N_8$; Eu, $Ca_2Si_5N_8$; Eu, $Sr_XCa_{1-X}Si_7N_{10}$; Eu (0<X<1), $SrSi_7N_{10}$; and Eu, $CaSi_7N_{10}$; Eu. In the foregoing constituents, one or more of Mg, Sr, Ca, Ba, Zn, B, Al, Cu, Mn, Cr and Ni may be included.

The following fluorescent materials are available: $Sr_2Si_5N_8$; Eu, Pr, $Ba_2Si_5N_8$; Eu, Pr, $Mg_2Si_5N_8$; Eu, Pr, $Zn_2Si_5N_8$; Eu, Pr, $SrSi_7N_{10}$; Eu, Pr, $BaSi_7N_{10}$; Eu, Ce, $MgSi_7N_{10}$; Eu, Ce, $ZnSi_7N_{10}$; Eu, Ce, $Sr_2Ge_5N_8$; Eu, Pr, $Ba_2Ge_5N_8$; Eu, Pr, $Mg_2Ge_5N_8$; Eu, Pr, $Zn_2Ge_5N_8$; Eu, Pr, $SrGe_7N_{10}$; Eu, Ce, $BaGe_7N_{10}$; Eu, Pr, $MgGe_7N_{10}$; Eu, Pr, $ZnGe_7N_{10}$; Eu, Ce, $Sr_{1.8}Ca_{0.2}Si_5N_8$; Eu, Pr, $Ba_{1.8}Ca_{0.2}Si_5N_8$; Eu, Ce, $Mg_{1.8}Ca_{0.2}Si_5N_8$; Eu, Pr, $Zn_{1.8}Ca_{0.2}Si_5Ns$; Eu, Ce, $Sr_{0.8}Ca_{0.2}Si_7N_{10}$; Eu, La, $Ba_{0.8}Ca_{0.2}Si_7N_{10}$; Eu, La, $Mg_{0.8}Ca_{0.2}Si_7N_{10}$; Eu, Nd, $Zn_{0.8}Ca_{0.2}Si_7N_{10}$; Eu, Nd, $Sr_{0.8}Ca_{0.2}Ge_7N_{10}$; Eu, Tb, $Ba_{0.8}Ca_{0.2}Ge_7N_{10}$; Eu, Tb, $Mg_{0.8}Ca_{0.2}Ge_7N_{10}$; Eu, Pr, $Zn_{0.8}Ca_{0.2}Ge_7N_{10}$; Eu, Pr, $Sr_{0.8}Ca_{0.2}Si_6GeN_{10}$; Eu, Pr, $Ba_{0.8}Ca_{0.2}Si_6GeN_{10}$; Eu, Pr, $Mg_{0.8}Ca_{0.2}Si_6GeN_{10}$; Eu, Y, $Zn_{0.8}Ca_{0.2}Si_6GeN_{10}$; Eu, Y, $Sr_2Si_5N_8$; Pr, $Ba_2Si_5N_8$; Pr, $Sr_2Si_5N_8$; Tb, $BaGe_7N_{10}$; Ce, and so on.

(6) Sulfide fluorescent materials: $(Zn_{1-X}, Cd_X)$ S: Cu, Al (where $0 \leq X \leq 0.30$), $(Zn_{1-X}, Cd_Xx)$ S; Cu, Cl (where $0 \leq X \leq 0.30$), $(Zn_{1-X}, Cd_X)$ S; Ag, Cl (where $0 \leq X \leq 0.90$), $(Zn_{1-X}, Cd_X)$ S; Ag, Al (where $0 \leq X \leq 0.90$), ZnS ; Au, Cu, Al, ZnS; Ag, Cu, ZnS; Ag, Fe, Al, ZnS; Cu, Ag, Cl, ZnS; Tm, ZnS; Pb, Cu, ZnS; Zn, ZnS; Zn, Ga, Zn $(S_{1-X}, Se_x)$; Ag, $(Zn_{1-X}, Cd_X)$ S; Ag, Ni, $(Zn_{1-X}, Cd_X)$ S; Au, Ag, Al, ZnS; Cu, Au, Al, $(Zn_{1-X}, Cd_X)$S; Au, Al, $(Zn_{1-X}, Cd_X)$S; Au, Cu, Al $(Zn_{1-X}, Cd_X)$ S; Ag, Ni.

(7) Oxysulfide fluorescent materials: $(Ln_{1-X}Eu_X)$ $O_2S$ Ln is Sc, Y, La or Gd, and satisfies the composition ratio of $0 \leq X \leq 1$.

(8) YAG group fluorescent materials: $(Y_{1-X-Y-Z}, Gd_X, La_Y, Sm_Z)_3$ $(Al_{1-V}, Ga_V)_5O_{12}$; Ce, Eu (where $0 \leq X \leq 1$, $0 \leq Y \leq 1$, $0 \leq Z \leq 1$, $0 \leq V \leq 1$).

(9) Phosphate boric acid fluorescent materials: $2(M_{1-X}, M'_X)O.aP_2O_5 \cdot bB_2O_3$ In this case, M is Mg, Ca, Sr, Ba or Zn, and M' is Eu, Mn, Sn, Fe or Cr. The composition ratio is in the range of $0.001 \leq X \leq 0.5$, $0 \leq a \leq 2.0$, $0 \leq b \leq 3$, $0.3 < a+b$.

(10) Halphosphate acid salt fluorescent materials: $(M_{1-X}Eu_X)_{10}$ $(PO_4)_6$ $Cl_2$, or $(M_{1-X}Eu_X)_5$ $(PO_4)_3$ Cl.

In this case, M is Ba, Sr, Ca or Mg. The compsotion ratio is in the range of $0 \leq X \leq 1$.

Fluorescent materials in items (11) to (14) emitting the following colors (blue, yellow, green, red and white) are also available. The silicate fluorescent materials in the foregoing items (1) and (2) are usable as yellow fluorescent materials.

(11) Blue florescent materials: $Sr_3(PO_4)_2$; Eu, (Sr, Mg)$_2$ $P_2O_7$; Eu, $Sr_2P_2O_7$; Eu, $Sr_2P_2O_7$; Sn, $Ba_2P_2O_7$; Ti, (Sr, Mg)$_3$ $(PO_4)_2$; Cu, (Sr, Ca)$_{10}$ $(PO_4)_6$ $Cl_2B_2O_3$; Eu, (Ba, Mg) $Si_2O_5$; Eu, (Sr, Ba) $Al_2Si_2O_8$; Eu, $Sr_2Si_3O_8.2SrCl_2$; Eu, $Ba_3MgSi_2O_8$; Eu, $Zn_2SiO_4$; Ti, $BaAl_8O_{13}$; Eu, $BaMg_2Al_{16}O_{27}$; Eu, Mn, $CaAl_2O_4$; Eu, Nd, $Sr_4Al_{14}O_{25}$; Eu, $SrMgAl_{10}O_{17}$; Eu, $BaMgAl_{10}O_{17}$; Eu, $SrAl_4O_7$; Eu, Dy, $Sr_4Al_{14}O_{25}$; Eu, Dy, $CaWO_4$, $CaWO_4$; Pb, $MgWO_4$, $ZnGa_2O_4$, $Y_2SiO_5$; M1 (where M1 is Tm or Ce), (Ca, Mg) $SiO_3$; Ti, $CaF_2$; Eu, $M_{22}O_2S$; Tm (where M2 is Y, La, Gd, or Lu), $M_2O_X$; Ce (where M2 is Y, La, Gd or Lu, and X is Br or Cr). $(M_2, M_3)$ $TaO_4$; Nb (where $M_2$ is Y, La, Gd or Lu, and $M_3$ is Mg, Ca, Sr or Ba).

(12) Green fluorescent materials: $BaMg_2Al_{16}O_{27}$; Eu, $BaAl_{12}O_{19}$; Mn, $Ca_{10}(PO_4)_6F_2$; Sb, Mn, $CeMgAl_{11}O_{19}$; Tb, $GdMgB_5O_{10}$; Ce, Tb, $La_2O_3.2SiO_20.9P_2O_5$; Ce, Tb, $MgAl_{11}O_{19}$; Ce, Tb, Mn, $MgGa_2O_4$; Mn, $SrAl_2O_4$; E, $SrAl_2O_4$; Eu, Dy, $Y_2O_3.Al_2O_3$; Tb, $Y_2SiO_5$; Ce, Tb, $YBO_3$; Tb, $Zn_2GeO_4$; Mn, $Sr_5(PO_4)_3$ F:Sb, $BaMg_2Al_{16}O_{27}$; Eu, Mn, ZnO; Zn, $M_{22}O_2S$; Tb (where $M_2$ is Y, La, Gd or Lu), $M_{22}O_2S$; Pr (where $M_2$ is Y, La, Gd or Lu), $M_2O_X$; Tb (where $M_2$ is Y, La, Gd or Lu, and X is Br or Cr), $InBO_3$; Tb, $Li_5Zn_8Al_5(GeO_4)_4$; Mn, $SrGa_2S_4$; Eu, $Y_2(Si, Ge)O_5$; Tb, $Y_2SiO_5$; Pr, $Y_2SiO_5$; Tb, $Y_3Al_5O_{12}$; Cr, Tb, $Y_3(Al, Ga)_5O_{12}$; Tb, $Y_3Al_5O_{12}$; Tb, $YF_3$; Er, $Zn_2SiO_4$; Mn, $Zn_2SiO_4$; Mn, Al, $Zn_2SiO_4$; Mn, As, $(M_2, M_3)$ $TaO_4$; Tb (where $M_2$ is Y, La, Gd or Lu, and $M_3$ is Mg, Ca, Sr or Ba).

(13) Red fluorescent materials: $M_2BO_3$; Eu (where $M_2$ is Y, La, Gd or Lu), (Sr, Mg)$_3$(PO$_4$)$_2$; Sn, $Mg_6As_2O_{11}$; Mn, $CaSiO_3$; Pb, Mn, $Cd_2B_2O_5$; Mn, $YVO_4$; Eu, (Ca, Zn, Mg)$_3$ $(PO_4)_2$; Sn, (Ce, Gd, Tb) $MgB_5O_{10}$; Mn, $Mg_4FGeO_6$; Mn, $Mg_4F(Ge, Si)$ $O_6$; Mn, $SrTiO_3$; Pr, Al, $CaTiO_3$; Eu, $Gd_2O_3$; Eu, $(Gd, M_4)_2$ $O_3$; Eu(where $M_4$ is Y, La or Lu), $M2_2O_2S$; Eu, Mg, $M_5$ (where $M_2$ is Y, La, Gd or Lu, and $M_5$ is Y, La, Gd or Lu, and $M_5$ is Ti, Nb, Ta or Ga), $MgF_2$; Mn, (KF, $MgF_2$); Mn, (Zn, Be)$_2$ $SiO_4$; Mn, $Zn_3(PO_4)_2$; Mn, (Zn, Ca)$_3$ $(PO_4)_2$; Mn, (Zn, Mg) $F_2$; Mn, $CaSiO_3$; Pb, Mn, $Cd_5Cl$ $(PO_4)_3$; Mn, $InBO_3$; Eu, $MgGeO_4$; Mn, $MgSiO_3$; Mn, $SnO_2$; Eu, $YVO_4$; Eu, $ZrO_2$; Eu, $(M_2, M_3)$ $TaO_4$; Eu (where $M_2$ is Y, La, Gd or Lu, and $M_3$ is Y, La, Gd or Lu, $M_3$ is Y, La, Gd or Lu, and $M_3$ is Mg, Ca, Sr or Ba).

(14) White fluorescent materials: $3Ca_3(PO_4)_2$ Ca(F, Ci)$_2$; Sb, $YVO_4$; Dy, $Y_2O_2S$; Tb,Sm Additive colors may be prepared by blending a plurality of the foregoing fluorescent materials. For instance, a white light fluorescent material may be prepared by mixing dye compounds corresponding to RGB to make a base fluorescent material, or by mixing the foregoing dye compounds.

In the first embodiment, the fluorescent elements 3 contain 20 wt % or more fluorescent materials in the fluorescent base so that the fluorescent elements 3 do not transmit light beams from the light emitting element 2. Specifically, the fluorescent elements 3 contain 50 wt % or more of silicate fluorescent materials in the fluorescent base of the resin, thereby preventing light beams from the light emitting element 2 from being transmitted. Further, the fluorescent materials are granules having a diameter of 20 nm or larger and assuring high light intensity and high light emitting efficiency.

[First Method of Making Fluorescent Element]

Figure 5:
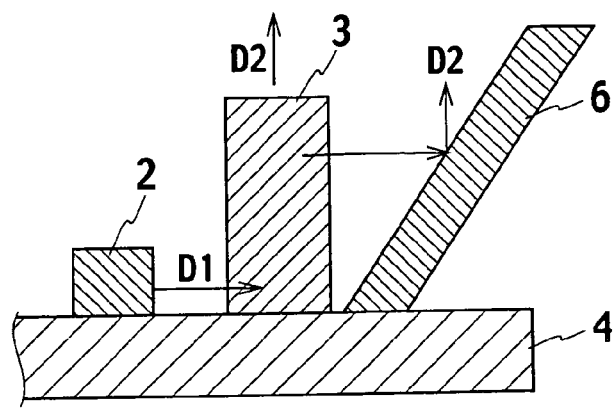
FIG. 5 is a cross section of a first fluorescent element in the semiconductor light emitting device of FIG. 1.

The fluorescent element 3 shown in FIG. 5 has a rectangular cross section, and is easily made by molding the fluorescent base containing the fluorescent material on the substrate 4.

Alternatively, the fluorescent element 3 may be prepared by the molding process beforehand, and may be mechanically attached on the substrate 4 using a resin adhesive whose ingredient is similar to the ingredient of the fluorescent base.

[Second Method of Making Fluorescent Element]

Figure 6:
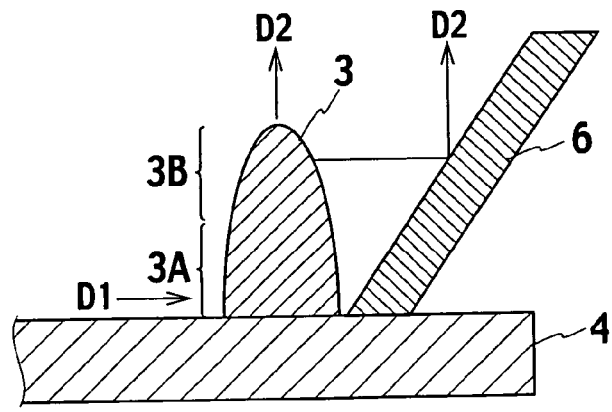
FIG. 6 is a cross section of a second fluorescent element in the semiconductor light emitting device of FIG. 1.

Referring to FIG. 6, the fluorescent element 3 has a parabolic cross section, and includes a light absorbing area 3A which absorbs direct light beams from the light emitting element 2, and a light diffusing area 3B which diffuses light beams in the second direction D2 (a light take-out direction). The light diffusing area 3B is larger than the light absorbing area 3A, which is effective in increasing an amount of light beams to be taken out. The direct light beams from the light emitting element 2 are illuminated onto the light absorbing area 3A. The light absorbing area 3A is at the lower part of the fluorescent element 3, and is in contact with the substrate 4. The light diffusing area 3B is on top of the light absorbing area 3A.

The parabolic fluorescent element 3 is made as follows. First of all, the light emitting element 2 is mounted on the surface of the substrate 4 (see FIG. 1 and FIG. 2). The first main electrode of the light emitting element 2 is electrically connected to the wiring 42 of the substrate 4, and the second main electrode is electrically connected to the wiring 43 using a wire 5. Thereafter, lighting performance of the light emitting element 2 is tested and confirmed. Then, the fluorescent base containing the fluorescent material is dropped onto the substrate 4 using a dispenser, and is immediately solidified, thereby completing the fluorescent element 3. The fluorescent element 3 is made parabolic by adjusting manufacturing conditions such as viscosity, surface tension, and gravity.

[Light Emission of Light Emitting Element]

When an actuating voltage is applied between the first and second main electrodes of the light emitting element 2, light beams are emitted from the light emitting layer (e.g., the AlGaInN light emitting layer 205 shown in FIG. 3) in the first direction D1, and are illuminated onto and absorbed by the fluorescent elements 3. The fluorescent elements 3 are excited by the absorbed light beams, and diffuse light beams in the second direction D2. Light beams diffused by the fluorescent elements 3 are reflected by the reflector 6 in the second direction D2.

The fluorescent elements 3 of the first embodiment are designed not to transmit light beams arriving from the light emitting element 2, so that no high energy light beams will be emitted in the second direction D2.

Examples of the First Embodiment

In each semiconductor light emitting device 1 in examples of the first embodiment, the substrate 4 includes a reflecting section 46 (equivalent to the reflector 6) as its integral part, i.e., the substrate 4 is in the shape of an AlN cup, and is easily made by a molding process. The light emitting element 2 having an InAlGaN light emitting layer is mounted on the substrate 4. The InAlGaN light emitting layer emits blue laser beams. The wiring 42 of the substrate 4 is electrically connected to the light emitting element 2 using the wire 5, thereby making the fluorescent element 3 on the substrate 4. The fluorescent element 3 is made of a silicone resin as the fluorescent base. The fluorescent base contains 75 wt % of three fluorescent materials for three optical primary colors. The blue fluorescent material is $(Sr, Ca, Ba)_{10}(PO_4)_6 Cl_2$; Eu. The green fluorescent material is $3(Ba, Mg) O, 8Al_2O_3$; Eu, Mn. The red fluorescent material is $La_2O_2S$; Eu. The fluorescent base is dropped using a dispenser onto the substrate 4 which is heated to 120° C., is solidified, and finally becomes paraboloidal.

An operating voltage is applied between the main electrodes of the light emitting element 2, so that the light emitting element 2 emits laser beams in the first direction D1. The laser beams are illuminated onto the fluorescent element 3, which diffuses white light beams in the second direction D2.

FIRST MODIFIED EXAMPLE

Figure 8:
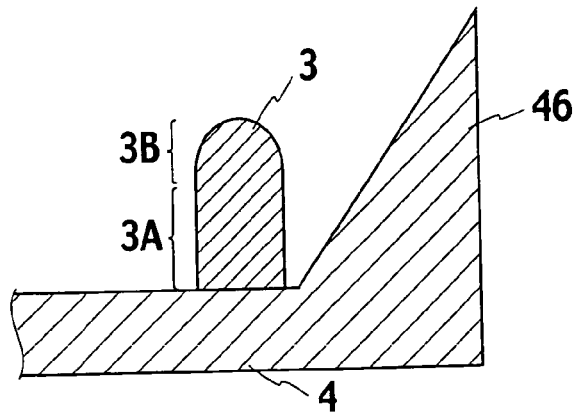
FIG. 8 is a cross section of an essential part of a semiconductor light emitting device of a first modified example of the first embodiment.
Figure 9:
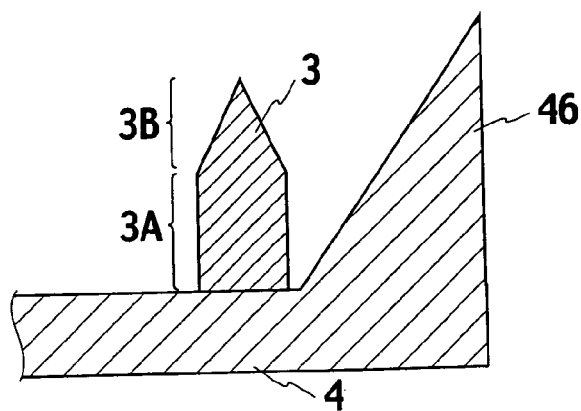
FIG. 9 is a cross section of an essential part of a further semiconductor light emitting device in the first modified example.

In this example, cross sections of the fluorescent elements 3 are as shown in FIG. 8 and FIG. 9. However, the substrate 4 is the same as that shown in FIG. 7.

The fluorescent element 3 in FIG. 8 is in the shape of inverted U while the fluorescent element 3 in FIG. 9 is in the shape of a pencil. In either case, the light diffusing area 3B is designed to be large. The foregoing fluorescent elements 3 can be easily molded.

SECOND MODIFIED EXAMPLE

Figure 10:
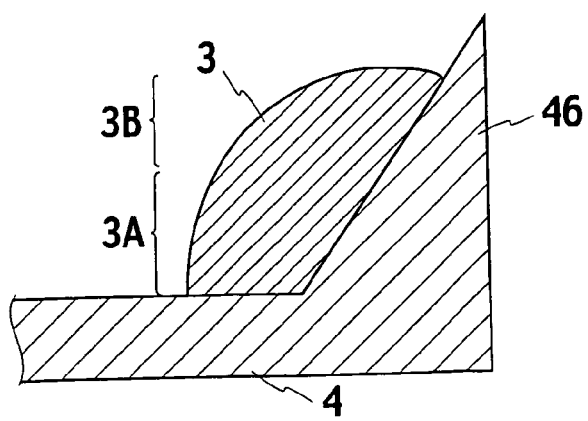
FIG. 10 is a cross section of an essential part of a semiconductor light emitting device in a second modified example.
Figure 11:
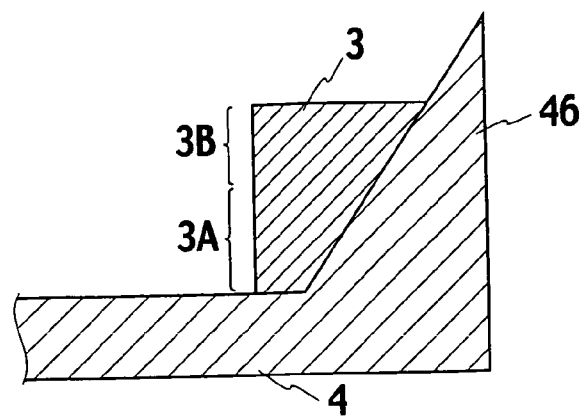
FIG. 11 is a cross section of an essential part of a further semiconductor light emitting device in the second modified example.

Referring to FIG. 10, a fluorescent element 3 has a cross section in the shape of a quarter sector while a fluorescent element 3 in FIG. 11 is in the shape of an inverted trapezoid. Surfaces of the light diffusing areas 3B on the fluorescent elements 3 are enlarged in order to increase an amount of light beams to be diffused. Further, the fluorescent element 3 extends over the reflecting section 46 and covers a light path of the light beams emitted by the light emitting element 2. This is effective in lengthening the light path via which light beams are absorbed, and suppressing leakage of light beams. Further, the fluorescent element 3 is in contact with the reflecting section 46, so that the reflecting section 46 functions as a dam (i.e., a mold). This facilitates making of the fluorescent element 3 by dropping the material using the dispenser.

THIRD MODIFIED EXAMPLE

Figure 12:
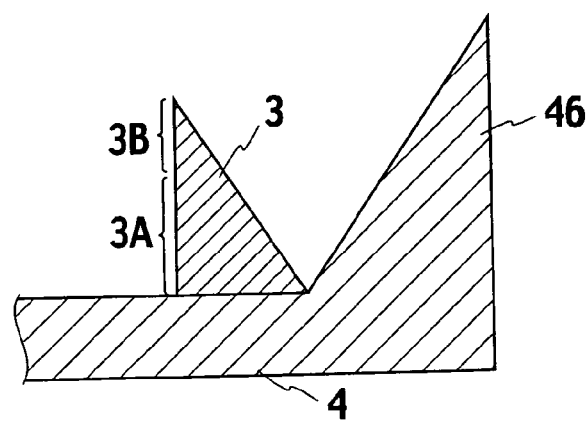
FIG. 12 is a cross section of an essential part of a semiconductor light emitting device in a third modified example.
Figure 13:
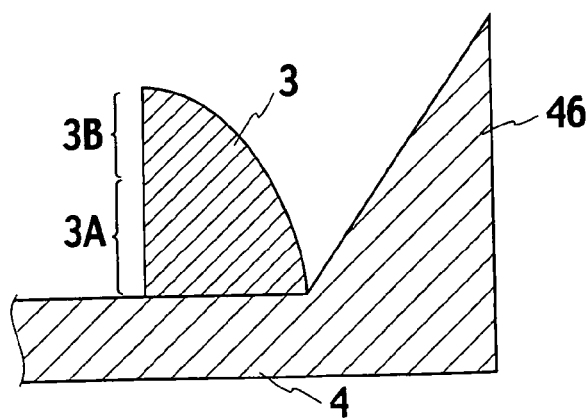
FIG. 13 is a cross section of the essential part of a further semiconductor light emitting device in the third modified example.
Figure 14:
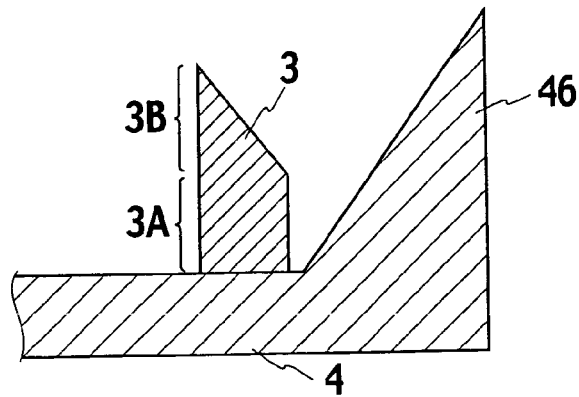
FIG. 14 is a cross section of an essential part of a still further semiconductor light emitting device in the third modified example.

In FIG. 12, the fluorescent element 3 has a triangular cross section. In FIG. 13, the fluorescent element 3 has a cross section in the shape of a quarter sector. The fluorescent element 3 in FIG. 14 has a cross section in the shape of a triangle and a rectangle. In each case, the fluorescent element 3 has an enlarged light absorbing area 3B in order to increase an amount of light beams to be diffused. Further, a part of the light absorbing area 3A extending in the first direction D1 is thickened in order to lengthen the light path absorbing light beams and to reduce leaking light beams.

FOURTH MODIFIED EXAMPLE

Figure 15:
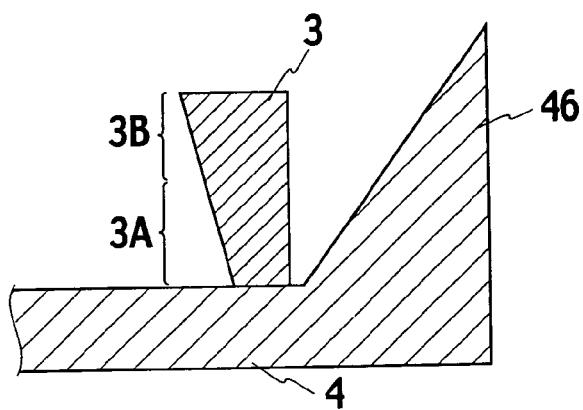
FIG. 15 is a cross section of an essential part of a semiconductor light emitting device in a fourth modified example.
Figure 16:
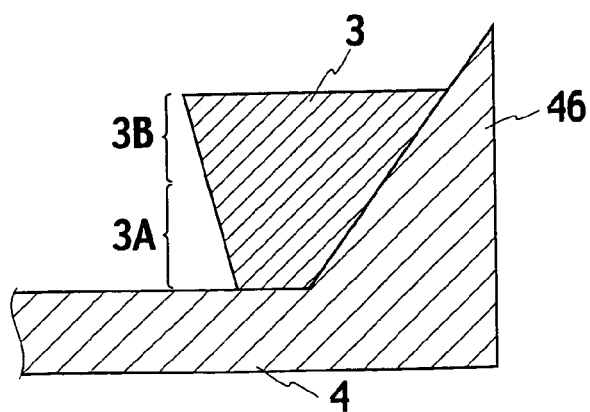
FIG. 16 is a cross section of an essential part of a further semiconductor light emitting device in the fourth modified example.
Figure 17:
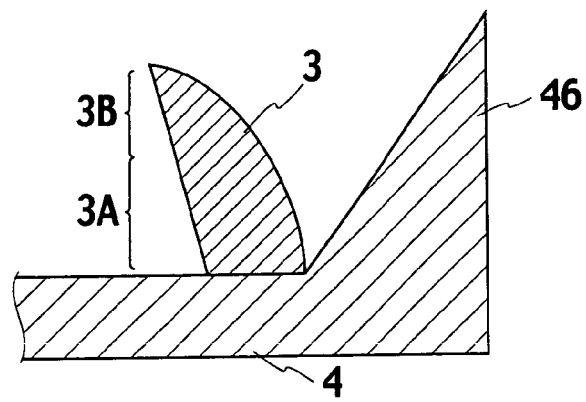
FIG. 17 is a cross section of an essential part of a still further semiconductor light emitting device in the fourth modified example.
Figure 18:
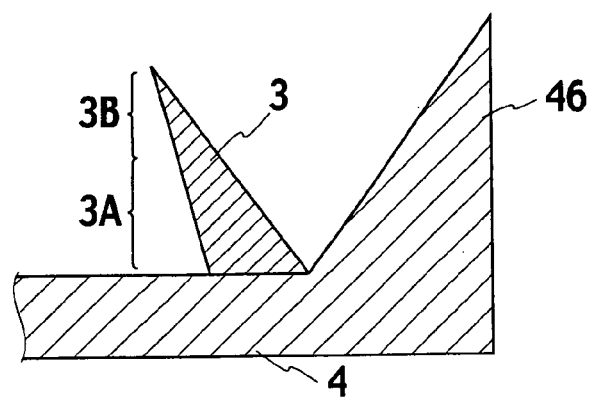
FIG. 18 is a cross section of an essential part of a still further semiconductor light emitting device in the fourth modified example.

Referring to FIG. 15 and FIG. 16, fluorescent elements 3 have cross sections in the shape of an inverted trapezoid. A fluorescent element 3 of FIG. 7 has a cross section in the shape of a fan, and a fluorescent element 3 of FIG. 18 has a triangular cross section. All of these fluorescent elements 3 are designed to have large light diffusing areas 3B, thereby increasing an a mount of light beams to be diffused. Further, a slightly acute angle is formed between the surface of the light diffusing area 3A of the fluorescent element 3 and the surface of the substrate 4. This allows that light beams which are emitted from the light emitting element 2 and are reflected on the fluorescent element 3 are guided toward the surface of the substrate 4. Therefore, it is possible to suppress leakage of light beams reflected on the fluorescent element 3.

Advantages of First Embodiment

In the semiconductor light emitting device of the first embodiment, high energy excited light beams from the light emitting element 2 are diffused in the first direction Dl which is different from the second direction D2 where light beams from the fluorescent element 3 are received. All of the high energy light beams are absorbed by the fluorescent element 3 which is a wavelength conversion material. This enables the use of all of the high energy exciting light beams from the light emitting element 2, and allows the fluorescent element 3 to diffuse light beams having large outputs and high brightness.

The semiconductor light emitting device 1 has a simple structure which adjusts the direction of the high energy exciting light beams from the light emitting element 2 and the direction of light beams diffused by the fluorescent element 3. This is effective in reducing the number of components and in promoting downsizing.

Second Embodiment

A semiconductor light emitting device 1 of the second embodiment is basically similar to the semiconductor light emitting device of the first embodiment, but is devised to improve a light leakage preventing function and a heat releasing function.

Figure 19:
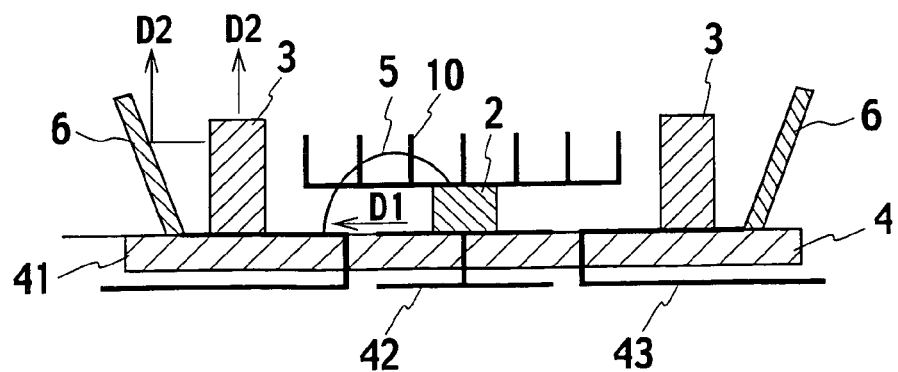
FIG. 19 is a cross section of a semiconductor light emitting device in a second embodiment of the invention.

Referring to FIG. 19, a semiconductor light emitting device 1 has a space defined between a light emitting element 2 and a fluorescent element 3, and a heat sink 10 on the light emitting element 2. The space is effective in dissipating heat generated in response to the operation of the light emitting element 2. Similarly, the heat sink 10 efficiently dissipates heat. The heat sink 10 has its rear surface facing with the substrate 4, and its front surface provided with fins in order to enhance heat dissipation.

The heat sink 10 is made of a material having high thermal conductivity and high reflecting power such as AlN, BN, Al, Cu, an Al alloy (e.g. Al—Si alloy), Si, or diamond. The light emitting element 2 and the heat sink 10 are mechanically fastened using a thermally conductive adhesive made of AuSn, Sn, PbSn, and Ag. The heat sink 10 having high reflecting power can reduce an amount of light beams passing therethrough, which is effective in suppressing leakage of light beams.

Third Embodiment

In a third embodiment, a semiconductor light emitting device 1 has a multi-chip module structure. A reflecting section 47 of the third embodiment is substantially similar to the reflector 6 or the reflecting section 46 in the first or second embodiment.

[Multi-Chip Module Structure]

Figure 20:
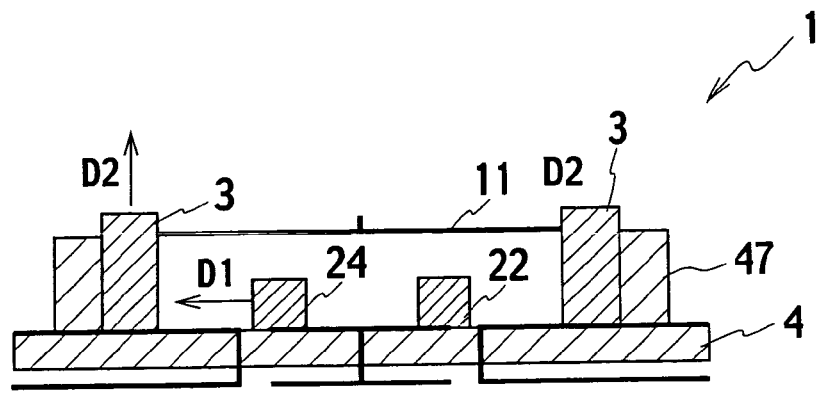
FIG. 20 is a cross section of a semiconductor light emitting device in a third embodiment of the invention.
Figure 21:
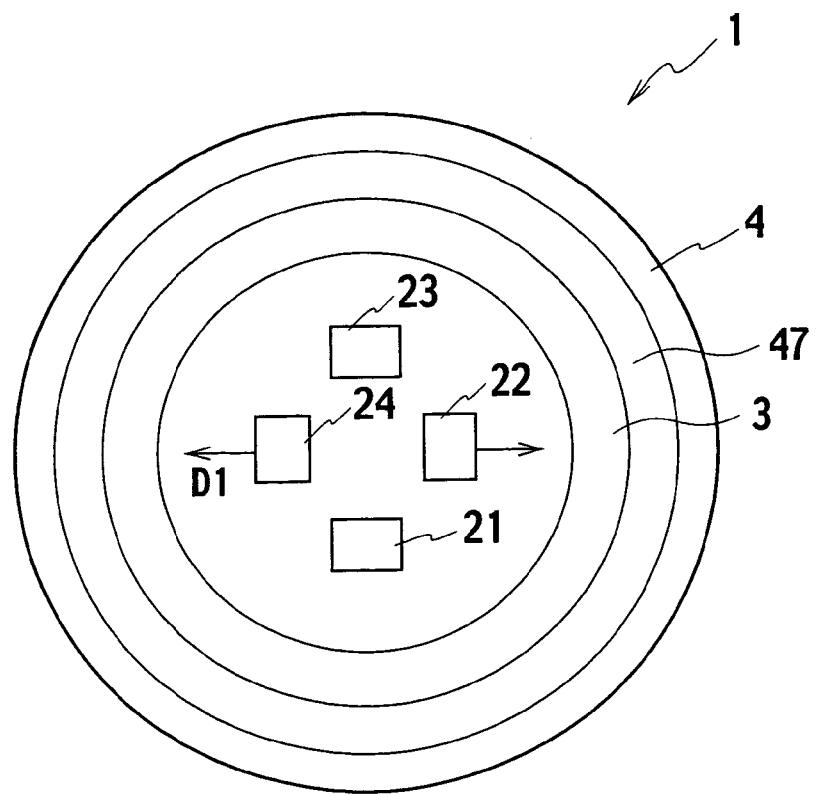
FIG. 21 is a top plan view of the semiconductor light emitting device of FIG. 20.

Referring to FIGS. 20 and 21, the semiconductor light emitting device 1 includes four light emitting elements 21 to 24 mounted on the center of a substrate 4, and an annular fluorescent element 3 extending around the substrate 4. The light emitting element 21 to 24 radially emit light beams toward the periphery of the substrate 4 (in the first direction D1).

It is assumed that the light emitting element 21 emits light beams in the first direction D1 at a reference angle (i.e., 0 degree). Light beams emitted by the light emitting element 22 are shifted by 90 degrees from the reference angle. Light beams emitted by the light emitting element 23 are shifted by 180 degrees from the reference angle. Further, Light beams emitted by the light emitting element 24 are shifted by 270 degrees from the reference angle.

The semiconductor light emitting device 1 also includes a shield 11 extending over a space defined by an inner peripheral edge of the reflecting 3, the substrate 4 and the light emitting elements 21 to 24. The shield 11 prevents leakage of light beams emitted from the light emitting elements 21 to 24. The shield 11 is made of a material similar to that of the heat sink 10 shown in FIG. 19.

The four light emitting elements 21 to 24 are used in the third embodiment. However, the number of light emitting elements may be optional, e.g., two, three, five, or more light emitting elements are usable.

[Structure of Reflecting Section (or Reflector)]

Figure 22:
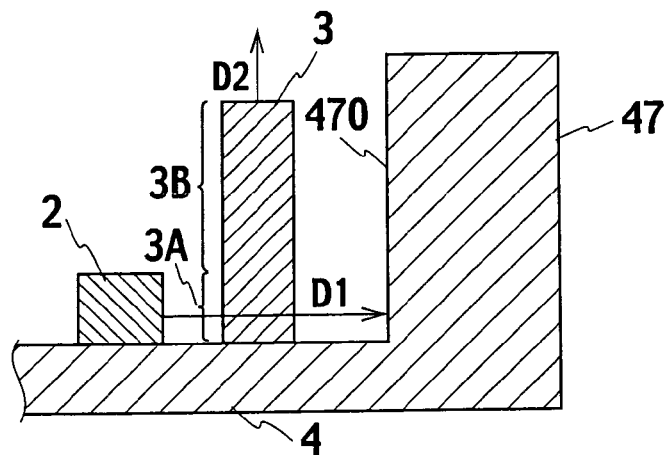
FIG. 22 is a cross section of an essential part of a semiconductor light emitting device in a first modified example of the third embodiment.

In the third embodiment, a reflecting section 47 is present on and is integral to the substrate 4 as shown in FIG. 20, FIG. 21 and FIG. 22. The reflecting section 47 itself is similar to the reflecting section 46 shown in FIG. 7. A reflecting surface 470 of the reflecting section 47 faces with the light emitting element 2, is perpendicular to the substrate 4, and reflects light beams, which arrive via the light absorbing area 3A of the fluorescent element 3, without making any difference between their incident angle and reflection angle. The reflecting surface 470 also reflects light beams emitted from the fluorescent element 3 without making any difference between their incident angle and reflection angle.

In other words, the reflecting surface 470 enables the fluorescent element 3 to re-absorb light beams which pass through and are emitted by the fluorescent element 3. This is effective in improving an optical absorption factor of the fluorescent element 3 and in preventing leakage of high energy light beams passing through the fluorescent element 3.

The reflecting section 47 is integral to the substrate 4 in the third embodiment. Alternatively, the reflecting section 47 may be a reflector 6 which is separate from the substrate 4. The reflector 6 may be mounted on the substrate 4 with its reflecting surface being perpendicular to the substrate 4. Further, the reflecting section 47 may be any of the reflecting section or reflector in first to third modified examples.

FIRST MODIFIED EXAMPLE

Figure 23:
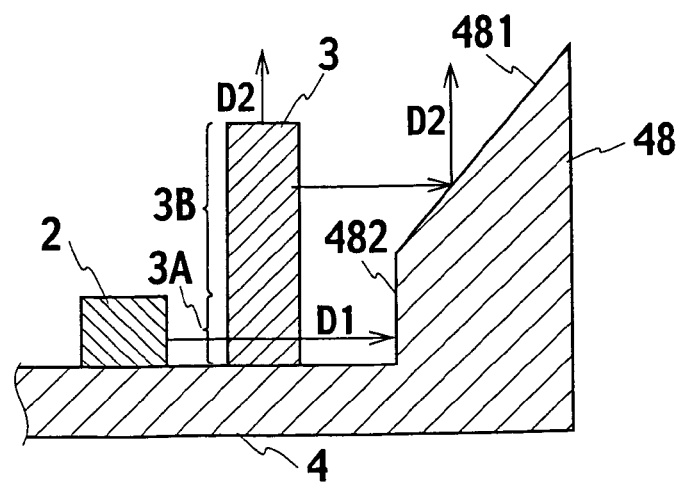
FIG. 23 is a cross section of an essential part of a semiconductor light emitting device in a second modified example of the third embodiment.

In a first modified example, a first semiconductor light emitting device 1 includes a substrate 4 and a reflecting section 48 which are integral. Refer to FIG. 23. The reflecting section 48 has a first reflecting surface which faces with the light absorbing area 3B of a fluorescent element 3, and a second reflecting surface 482 which faces with the light absorbing area 3A of the fluorescent element 3.

The second reflecting surface 482 is perpendicular to the substrate 4 similarly to the reflecting surface 470 of the reflecting section 47 shown in FIG. 22. In short, the second reflecting surface 482 re-reflects light beams passing through the light absorbing area 3A or diffused by the fluorescent element 3, toward the fluorescent element 3.

The first reflecting surface 481 is sloped by a certain angle to the substrate 4 similarly to the reflecting surfaces of the reflecting sections 46 shown in FIG. 8 to FIG. 18. In short, the reflecting surface 481 reflects light beams, from the light emitting area 3B of the fluorescent element 3, in the second direction D.

SECOND MODIFIED EMBODIMENT

Figure 24:
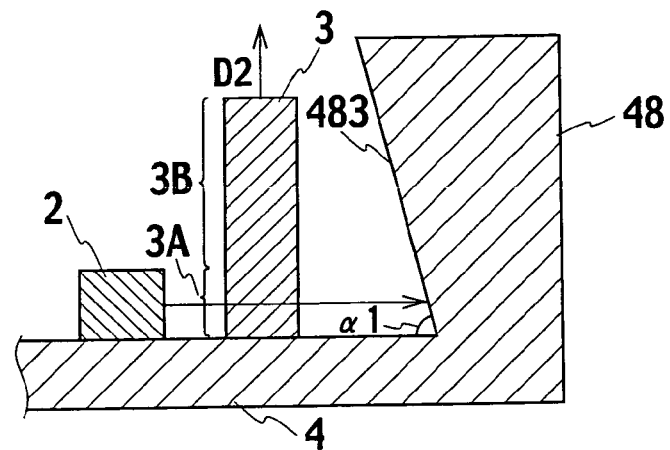
FIG. 24 is a cross section of an essential part of a semiconductor light emitting device in a third modified example of the third embodiment.

In this modified example, a substrate 4 includes a reflecting section 48 molded as its integral part as shown in FIG. 24. The reflecting section 48 has a reflecting surface 483 which is sloped to the substrate 4 with an angle $\alpha 1$ of less than 90 degrees. For instance, the angle $\alpha 1$ is 45 degrees<$\alpha 1$ <90 degrees.

The reflecting surface 483 re-reflects light beams, which pass through and are diffused by the light absorbing area 3A and the light diffusing area 3B of the fluorescent element 3, toward the fluorescent element 3 and the substrate 4. In short, the reflecting surface 483 positively suppresses the leakage of light beams passing through the fluorescent element 3.

THIRD MODIFIED EXAMPLE

Figure 25:
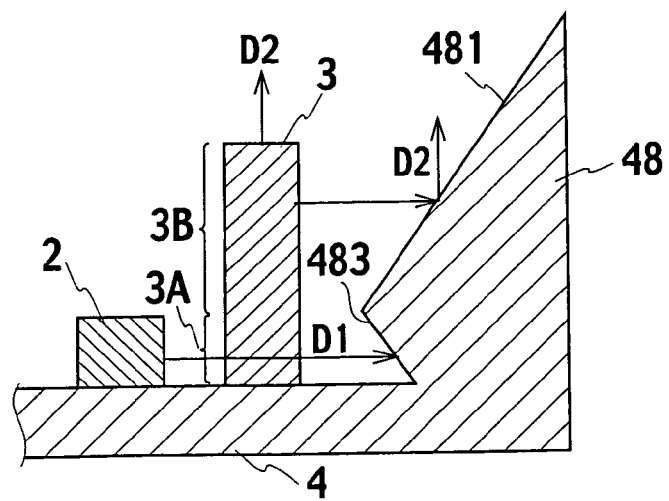
FIG. 25 is a cross section of an essential part of a semiconductor light emitting device in a fourth modified example of the third embodiment.

Referring to FIG. 25, the substrate 4 includes a reflecting section 48 molded as its integral part. The reflecting section 48 has a first reflecting surface 481 and a second reflecting surface 483. The first reflecting surface 481 faces with the light diffusing area 3B of the fluorescent element 3 while the second reflecting surface 483 faces with the light absorbing area 3A of the fluorescent element 3.

The second reflecting surface 483 faces with the substrate 4 with an acute angle $\alpha 1$ similarly to the reflecting surface 483 shown in FIG. 24. In short, the second reflecting surface 483 re-reflects light beams, passing through the light absorbing area 3A of the fluorescent element 3 or light beams emitted by the fluorescent element 3, toward the fluorescent element 3 and the substrate 4.

The first reflecting surface 481 faces with the substrate 4 with an obtuse angle similarly to the reflecting surface 481 shown in FIG. 23. In short, the first reflecting surface 481 reflects light beams, from the light diffusing area 3B of the fluorescent element 3, in the second direction D2.

Fourth Embodiment

Figure 26:
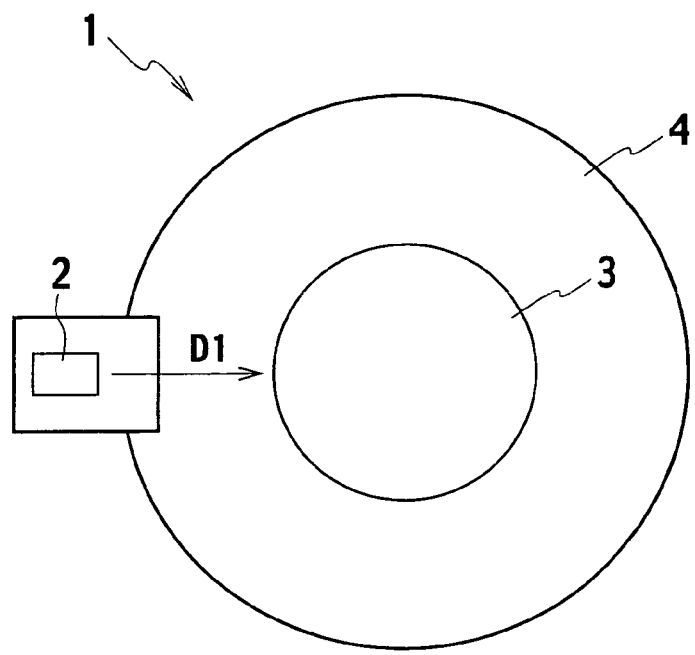
FIG. 26 is a top plan view of a semiconductor light emitting device in a fourth embodiment of the invention.

In this embodiment, the light emitting element 2 and fluorescent element 3 are relocated on the substrate 4. Referring to FIG. 26, the light emitting element 2 is positioned near the periphery of the substrate 4 while the fluorescent element 3 is at the center of the substrate 4. The light emitting element 2 emits light beams toward the center of the substrate 4 in the first direction D1. Light beams are absorbed by the fluorescent element 3, which diffuses excited light beams in the second direction D2. The second direction D2 in this case extends upward.

The fluorescent element 3 is cylindrical, although not shown. Alternatively, the fluorescent element 3 may be parabolic or conical, or may be in the shape of an inverted U or a pencil. The reflector 6 (of FIG. 1) and reflecting section 46 (of FIG. 7) are omitted in FIG. 26, and FIG. 27 to FIG. 29.

Figure 27:
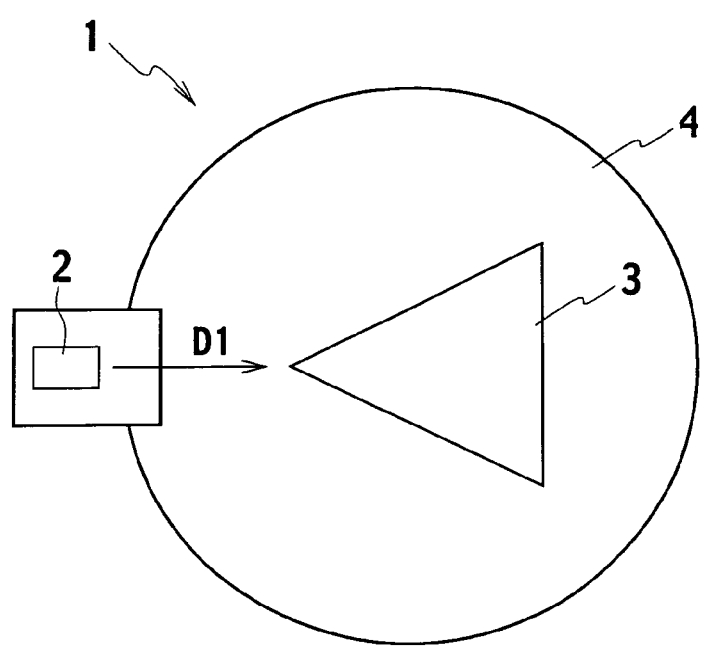
FIG. 27 is a top plan view of a semiconductor light emitting device in a modified example of the fourth embodiment.

The semiconductor light emitting device 1 shown in FIG. 27 includes a fluorescent element 3 in the shape of a triangular prism, which is positioned on the substrate 4. The remaining structure of the semiconductor light emitting device 1 is similar to the structure of the semiconductor light emitting device 1 of FIG. 26. Alternatively, the fluorescent element 3 may be a triangular pyramid.

Fifth Embodiment

In this embodiment, the semiconductor light emitting device 1 includes a diffusing element 7.

Figure 28:
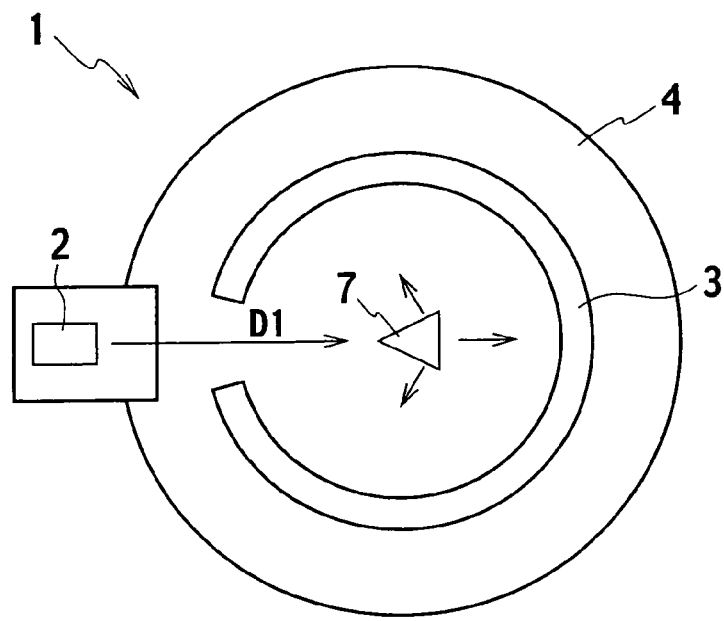
FIG. 28 is a top plan view of a semiconductor light emitting device according to a fifth embodiment of the invention.

Referring to FIG. 28, the light emitting element 2 is positioned near the periphery of the substrate 4, the fluorescent element 3 is arranged around the peripheral edge of the substrate 4, and the diffusing element 7 is arranged at the center of the substrate 4.

The light emitting element 2 emits light beams toward the diffusing element 7 in the first direction D1. The fluorescent element 3 is annular except for a part which corresponds to a path of light beams coming from the light emitting element 2 to the diffusing element 7. Alternatively, the diffusing element 7 may be triangular, in the shape of a triangular pyramid, or an inverted triangular pyramid.

Light beams outputted in the first direction D1 from the light emitting element 2 are illuminated onto the diffusing element 7, which uniformly diffuses the illuminated light beams toward the inner surface of the fluorescent element 3. The diffused light beams are absorbed by the fluorescent element 3, which emits excited light beams in the second direction D2. The second direction D2 extends upward in the plane of the drawing. In other words, the diffusing element 7 uniformly diffuses light beams, from the light emitting element 2, toward the fluorescent element 3. This is effective in improving an exciting ratio of the fluorescent element 3.

Figure 29:
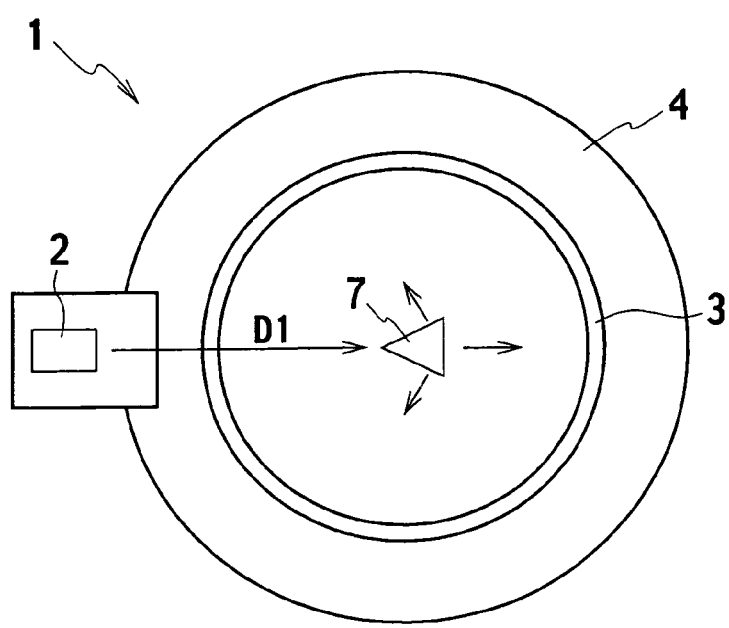
FIG. 29 is a top plan view of a semiconductor light emitting device in a modified example of the fifth embodiment.

As shown in FIG. 29, the fluorescent element 3 is in the shape of a perfect ring, and the fluorescent element 3 can be thinned at the part corresponding to the light path. The fluorescent element 3 lets light beams be outputted in the first direction D1, and enables light beams to be outputted from the light emitting element 2 and be illuminated onto the diffusing element 7.

Sixth Embodiment

Figure 30:
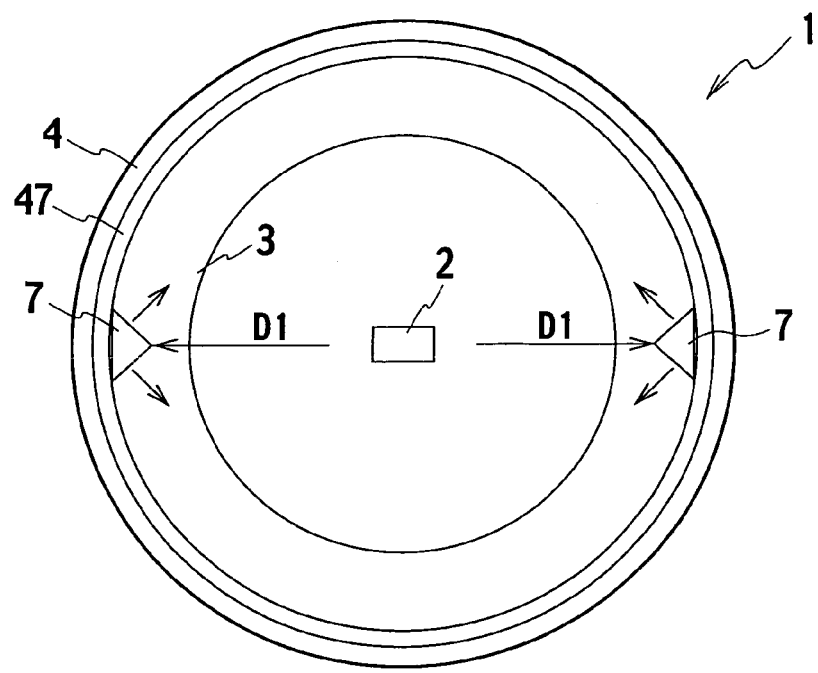
FIG. 30 is a top plan view of a semiconductor light emitting device according to a sixth embodiment of the invention.

In the sixth embodiment, the semiconductor light emitting device 1 includes the light emitting element 2 and the diffusing element 7 (shown in FIG. 29) relocated on the substrate, as shown in FIG. 30. Specifically, the light emitting element 2 is at the center of the substrate 4, the annular fluorescent element 3 are arranged near the periphery of the substrate 4, a reflecting section 47 is positioned around the fluorescent element 3 on the substrate, and two light diffusing elements 7 are arranged at the periphery of the fluorescent element 3. The light emitting element 2 emits light beams in the first directions D1 which are shifted from each other by 180 degrees. The two light diffusing elements 7 are at the destinations of the light beams emitted by the light emitting element 2. The light diffusing elements 7 are in the shape of a triangular prism, but may have any shape.

Light beams emitted by the light emitting element 2 in the first directions D1 are illuminated onto the fluorescent element 3, which diffuses excited light beams. Further, light beams from the light emitting element 2 pass through the fluorescent element 3, are diffused by the diffusing elements 7, and are uniformly re-illuminated onto the fluorescent element 3. The fluorescent element 3 diffuses excited light beams. Light beams, which are emitted by the light emitting element 2, passing through the fluorescent element 3, and diffused by the diffusing element 7 and reflecting section 47, are uniformly returned onto the annular fluorescent element 3. This is effective in improving conversion efficiency of excited light beams by the fluorescent element 3. Further, light beams are in the shape of a circle or a ring depending upon the shape of the fluorescent element 3.

In the sixth embodiment, the reflecting section 47 is integral with the substrate 4, so that the reflecting section 47 can efficiently reflect light beams from the fluorescent element 3, if no light diffusing elements 7 are provided.

Seventh Embodiment

According to the seventh embodiment, the reflecting sections 47 (or reflectors) also function as the diffusing elements 7.

Figure 31:
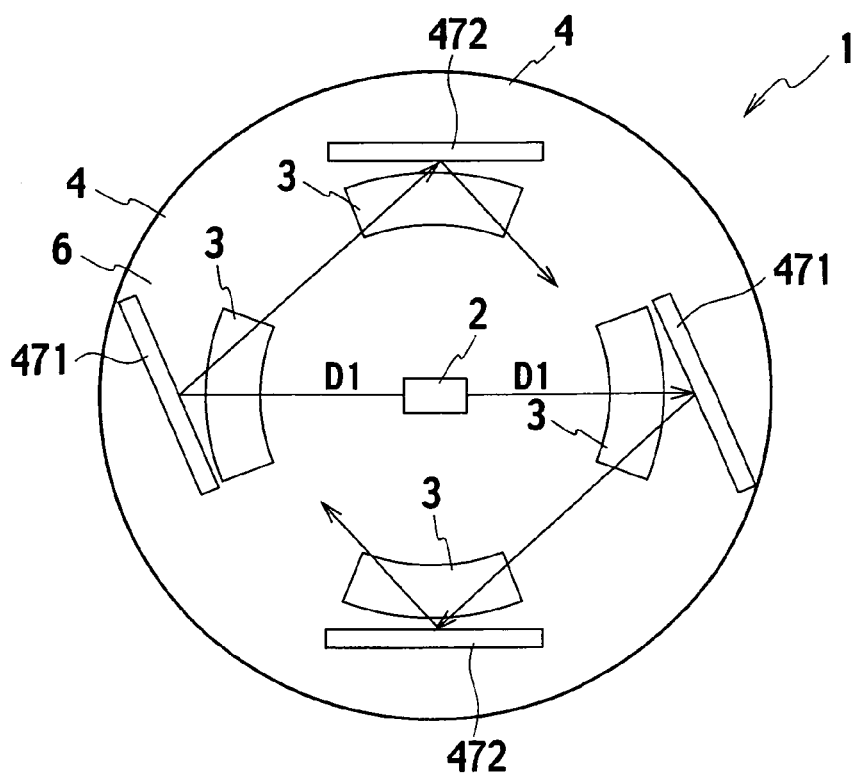
FIG. 31 is a top plan view of a semiconductor light emitting device according to a seventh embodiment of the invention.

Referring to FIG. 31, the light emitting element 2 is positioned at the center of the substrate 4, four quarter-ring-shaped fluorescent elements 3 are positioned along the periphery of the substrate 4, and four reflecting sections 471 and 472 are provided for the four fluorescent elements 3 near the periphery of the substrate 4. In this embodiment, the light emitting element 2 emits light beams in the first directions D1 which are shifted from each other by 180 degrees. Two of the four fluorescent elements 3 are positioned in areas which agree with paths of light beams emitted by the light emitting element 2. The foregoing areas are opposite from each other by 180 degrees. The remaining two fluorescent elements 3 are displaced by every 90 degrees from the two foregoing fluorescent elements 3. In other words, the four fluorescent elements 3 are displaced by 90 degrees around the light emitting element 2.

Each reflecting (inner) surface of each reflecting section 471, which directly reflects light beams from the light emitting element 2, is sloped by 67.5 degrees (or 112.5 degrees) with respect to the first direction D1, for example. In short, the reflecting sections 471 reflect light beams toward the next adjacent fluorescent elements 3 and the reflecting sections 472 which are arranged clockwise. Reflected light beams are also reflected by the light reflecting sections 472 toward the next adjacent fluorescent elements 3 and the reflecting sections 471. The reflecting surfaces of the reflecting sections 472 form 90 degrees to the normal line of the substrate 4.

In the semiconductor light emitting device 1, light beams emitted by the light emitting element 2 in the first direction D1 are illuminated onto the fluorescent elements 3, which diffuse excited light beams. Further, light beams passing through the fluorescent elements 3 are reflected by the reflecting sections 471 toward the next adjacent fluorescent elements 3 and reflecting sections 472. Still further, light beams are reflected by the reflecting sections 472 toward the next adjacent fluorescent elements 3 and reflecting sections 471. In other words, each time the reflecting sections 471 and 472 repeatedly reflect light beams, they diffuse excited light beams. This is effective in improving the optical conversion ratio.

The light emitting element 2 preferably emits radial and annular light beams.

Eighth Embodiment

Figure 32:
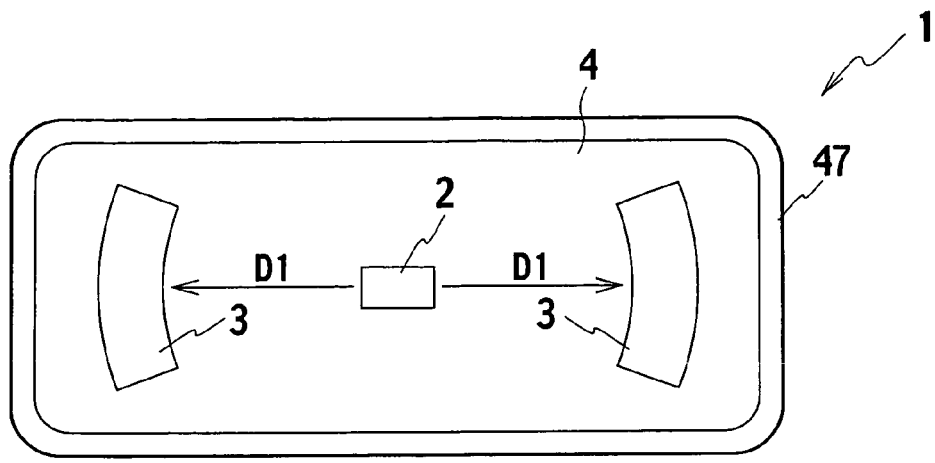
FIG. 32 is a top plan view of a semiconductor light emitting device according to an eighth embodiment of the invention.

The substrate 4 of this embodiment has a different profile. Referring to FIG. 32, the substrate 4 is rectangular, and includes the light emitting element 2 at its center, and two fluorescent elements 3 along short sides thereof. Further, the substrate 4 includes the reflecting section 47 extending around the periphery thereof as an integral part. The four corners of the substrate 4 and the reflecting section 47 are rounded. In this embodiment, a resonant cavity light emitting diode (RCLED) is applicable as the light emitting element 2.

Light beams emitted by the light emitting element 2 in the first directions D1 are illuminated onto the fluorescent elements 3, which diffuse excited light beams in the second direction D2 (upward).

Ninth Embodiment

This embodiment is intended to downsize the semiconductor light emitting device 1 of the eighth embodiment.

Figure 33:
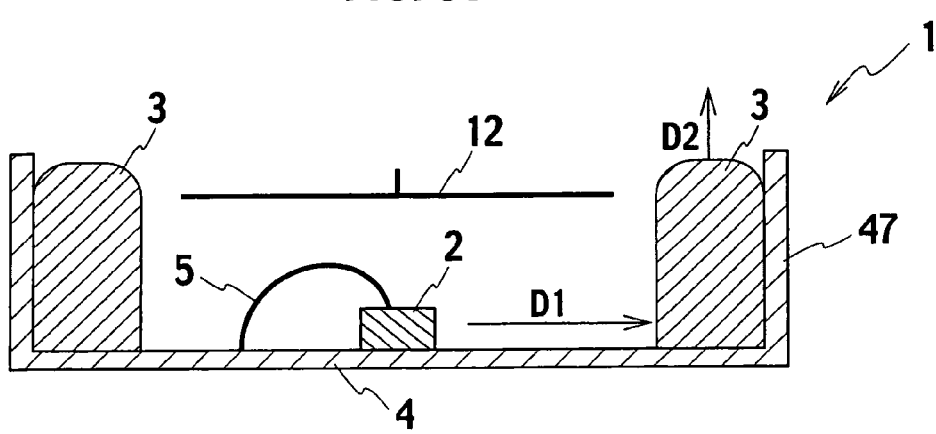
FIG. 33 is a cross section of a semiconductor light emitting device according to a ninth embodiment of the invention.
Figure 34:
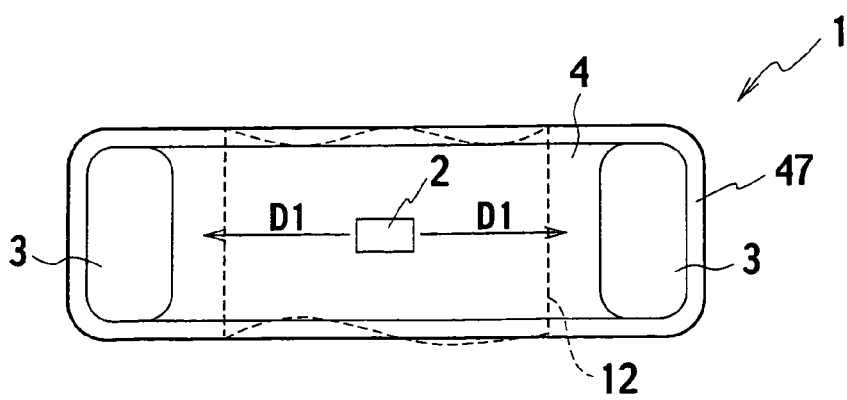
FIG. 34 is a top plan view of the semiconductor light emitting device of FIG. 33.

Referring to FIGS. 33 and 34, the semiconductor light emitting device 1 includes a substrate 4 which is one size smaller than the substrate 4 of the eighth embodiment. Specifically, the fluorescent elements 3 and the reflecting section 47 are arranged as close as possible. Further, the substrate 2 has a lid 12 extending over the light emitting element 2 and reaching the fluorescent elements 3. In order to downsize the semiconductor light emitting device 1, it is necessary to optimize light beams emitted by the light emitting element 2. For this purpose, the lid 12 is made of an Er complex compound having a scintillation effect, for example.

Tenth Embodiment

The semiconductor light emitting device 1 of the ninth embodiment is further downsized in this embodiment.

Figure 35:
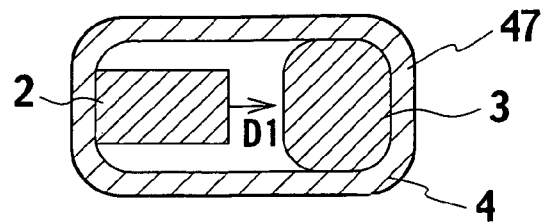
FIG. 35 is a top plan view of a semiconductor light emitting device according to a tenth embodiment of the invention.

In this embodiment, the substrate 4 is one size smaller than the substrate of the ninth embodiment, as shown in FIG. 35. The light emitting element 2 is positioned along one shorter side of the substrate 4 while the fluorescent element 3 is positioned along the other shorter side. In short, the light emitting element 2 emits light beams only in one direction. Light beams are absorbed by the fluorescent element 3, which diffuses excited light beams in the second direction D, upward.

The foregoing arrangement of the light emitting element 2 and the fluorescent element 3 can cut the substrate 4 by half compared to the case where two fluorescent elements 3 are provided centering around the substrate 4.

Eleventh Embodiment

Figure 36:
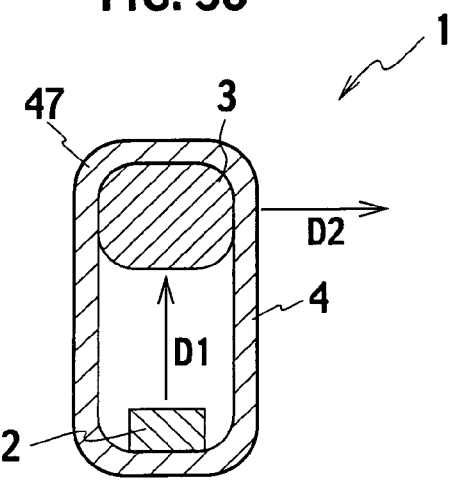
FIG. 36 is a top plan view of a semiconductor light emitting device according to an eleventh embodiment of the invention.

In this embodiment, the semiconductor light emitting device 1 includes a surface-emission type light emitting element 2 in place of the light emitting element 2 in the tenth embodiment, as shown in FIG. 36. Excited light beams are diffused from the fluorescent element 3 in the second direction D2 (from right to left in FIG. 36). A vertical cavity surface emitting semiconductor laser (VSCEL) is applicable as the light emitting element 2.

Figure 37:
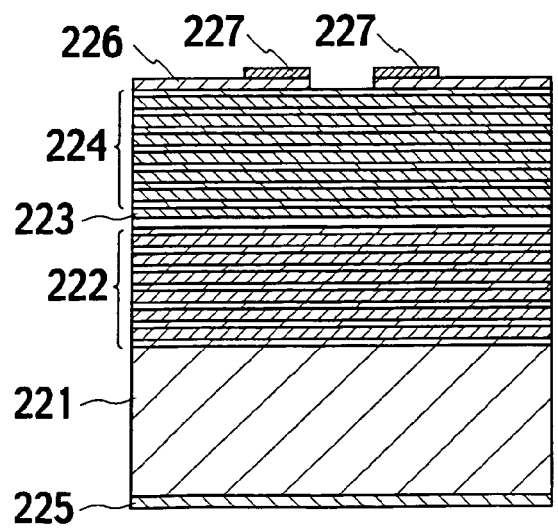
FIG. 37 is a cross section of a semiconductor light emitting element of the semiconductor light emitting device of FIG. 36.

Referring to FIG. 37, the surface emitting semiconductor laser is composed of an n-type CaAs substrate 221, a multi-layer reflecting mirror (DBR) 222, an active layer (MQW) 223, and a p-type multi-layer reflecting mirror (DBR) 224, all of which are superimposed one over after another. An n-type electrode 225 is placed on the n-type CaAs substrate 221, and a p-type electrode 227 is placed on the p-type multi-layer reflecting mirror 224.

The semiconductor light emitting device 1 of this embodiment can reduce its size similarly to the semiconductor light emitting device of the tenth embodiment.

The surface-emission type light emitting element 2 may be of any type in addition to that referred to in the eleventh embodiment. Further, the surface-emission type light element 2 is also applicable to the semiconductor light emitting devices 1 of the first to tenth embodiments.

Other Embodiments

The present invention is applicable not only to the foregoing embodiments but also general purpose lighting apparatuses, back lights for lighting apparatus for business use such as television systems or personal computers, lighting apparatuses for vehicles, bicycles and so on.

What is claimed is:

1. A semiconductor light emitting device comprising:
  a substrate;
  a semiconductor light emitting element provided on the substrate and emitting light beams in ultraviolet ranges and visible ranges only in a light emitting direction of the semiconductor light emitting element, the light emitting direction being parallel to a surface of the substrate and the semiconductor light emitting element being a laser diode; and
  a fluorescent element provided on the substrate, absorbing the light beams emitted from the semiconductor light emitting element, and outputting visible light beams in a light taking-out direction which is different from the light emitting direction; and
  a light shield which is provided above the semiconductor light emitting element, covers a space between the semiconductor light emitting element and the fluorescent element, and is configured to prevent leakage of the light beams emitted from the semiconductor light emitting element, the light shield having a reflecting power so as to reduce an amount of the light beams emitted from the semiconductor light emitting element passing through the light shield,
  wherein most of the light beams emitted from the light emitting element are absorbed in the fluorescent element so as to prevent the light beams from being emitted in the light taking-out direction.

2. A semiconductor light emitting device comprising:
a substrate;
a semiconductor light emitting element provided on the substrate and emitting light beams in ultraviolet ranges and visible ranges only in a light emitting direction of the semiconductor light emitting element, the light emitting direction being parallel to a surface of the substrate and the semiconductor light emitting element being a laser diode; And
a fluorescent element provided on the substrate, absorbing the light beams emitted from the semiconductor light emitting element, and outputting visible light beams in a light taking-out direction which is different from the light emitting direction; and
a heat sink provided on a surface of the semiconductor light emitting element opposite to the substrate, the heat sink having a reflecting power so as to reduce an amount of the light beams emitted from the semiconductor light emitting element passing through the heat sink,
wherein most of the light beams emitted from the light emitting element are absorbed in the fluorescent element so as to prevent the light beams from being emitted in the light taking-out direction.

3. The semiconductor light emitting device of claim 2, wherein the heat sink covers a space between the semiconductor light emitting element and the fluorescent element, and prevents leakage of the light beams emitted from the semiconductor light emitting element.

4. The semiconductor light emitting device of claim 2, further comprising a diffusing element which diffuses the light beams from the semiconductor light emitting element toward the fluorescent element.

5. The semiconductor light emitting device of claim 2, further comprising a reflector which reflects the visible light beams from the fluorescent element in the light taking-out direction.

6. The semiconductor light emitting device of claim 2, wherein the substrate includes a wiring supplying power to the semiconductor light emitting element.

7. The semiconductor light emitting device of claim 2, wherein the fluorescent element has not only a light absorbing area where direct light beams from the semiconductor light emitting element are illuminated but also a light diffusing area where the visible light beams are outputted in the light taking-out direction; and the light diffusing area is larger than the light absorbing area.

8. The semiconductor light emitting device of claim 6, wherein the fluorescent element outputs the visible light beams in the light taking-out direction which intersects the surface of the substrate.

9. The semiconductor light emitting device of claim 2, wherein the semiconductor light emitting element has an $Al_XGa_YIn_{1-X-Y}N$ ($0 \leq X \leq 1, 0 \leq Y \leq 1, 0 \leq X+Y \leq 1$) light emitting layer or an $Mg_xZn_{1-x}O$ ($0 \leq X \leq 1$) light emitting layer.

10. The semiconductor light emitting device of claim 2, wherein the semiconductor light emitting element is an edge emitting laser diode, a circle emitting laser or a surface emitting laser diode which emits light beams in two or more different directions.

11. The semiconductor light emitting device of claim 2, wherein the fluorescent element comprises a matrix of a light transmitting resin, glass, a sintered material or ceramics, and fluorescent materials contained in the matrix.

12. The semiconductor light emitting device of claim 2, wherein the fluorescent element has a cross section in the shape of a rectangle, a parabola, a letter U, a pencil, a fan, a trapezoid or a triangle.

13. The semiconductor light emitting device of claim 11, wherein the fluorescent materials are any one of silicate fluorescent materials, aluminates fluorescent materials, nitride fluorescent materials, sulfide fluorescent materials, oxysulfide fluorescent materials, YAG (yttrium-aluminum-garnet) fluorescent materials, phosphate boric acid fluorescent materials and haiphosphate acid salt fluorescent materials.

14. The semiconductor light emitting device of claim 11, wherein the fluorescent materials are blue fluorescent materials, green fluorescent materials, yellow fluorescent materials, red fluorescent materials or white fluorescent materials.

15. The semiconductor light emitting device of claim 11, wherein the fluorescent element contains 20 wt % or more of the fluorescent materials in the matrix.

16. The semiconductor light emitting device of claim 11, wherein the fluorescent element contains 50 wt % or more of the silicate materials in the matrix.

17. The semiconductor light emitting device of claim 5, wherein the reflector comprises a reflecting base made of an AlN, $Al_2O_3$, BN, plastics, ceramics or diamond, and a coating layer having a light reflecting or absorbing function.

* * * * *